United States Patent [19]
Dudek et al.

[11] Patent Number: 5,948,594
[45] Date of Patent: Sep. 7, 1999

[54] FLEXOGRAPHIC PRINTING FORMS FOR UV-HARDENABLE PRINTING INKS

[75] Inventors: Dietmar Dudek, Langen; Konrad Hinz; Bernd Struck, both of Dreieich, all of Germany

[73] Assignee: E. I. du Pont de Nemours and Company, Wilmington, Del.

[21] Appl. No.: 08/931,051

[22] Filed: Sep. 16, 1997

[30] Foreign Application Priority Data

Sep. 27, 1996 [DE] Germany .......................... 196 39 767

[51] Int. Cl.[6] .................. G03F 7/033; G03F 7/11
[52] U.S. Cl. ............................................ 430/273.1
[58] Field of Search .......................... 430/273.1

[56] References Cited

U.S. PATENT DOCUMENTS

| | | | |
|---|---|---|---|
| 3,333,024 | 7/1967 | Haefele et al. | 525/314 |
| 3,431,323 | 3/1969 | Jones | 525/258 |
| 4,126,466 | 11/1978 | Roos | 96/84 UV |
| 4,162,919 | 7/1979 | Richter et al. | 430/286 |
| 4,197,130 | 4/1980 | Nakamura et al. | 430/286 |
| 4,266,005 | 5/1981 | Nakamura et al. | 430/271 |
| 4,320,188 | 3/1982 | Heinz et al. | 430/281 |
| 4,323,636 | 4/1982 | Chen | 430/271 |
| 4,430,417 | 2/1984 | Heinz et al. | 430/286 |
| 4,460,675 | 7/1984 | Gruetzmacher et al. | 430/300 |
| 4,622,088 | 11/1986 | Min | 430/273.1 |
| 4,719,261 | 1/1988 | Bunnelle et al. | 525/97 |
| 5,112,725 | 5/1992 | Kurtz et al. | 430/306 |
| 5,472,824 | 12/1995 | Schober et al. | 430/309 |
| 5,863,704 | 1/1999 | Sakurai et al. | 430/271.1 |

FOREIGN PATENT DOCUMENTS

| | | | |
|---|---|---|---|
| 0 362 850 A2 | 4/1990 | European Pat. Off. | C08L 53/02 |
| 0 525 206 a1 | 2/1993 | European Pat. Off. | G03F 7/038 |
| 0 696 761 A1 | 2/1996 | European Pat. Off. | G03F 7/038 |

OTHER PUBLICATIONS

Handbook of Polymer Science & Technology, vol. 1 (Synthesis and Properties) pp. 115–117, 1989.

*Primary Examiner*—Janet Baxter
*Assistant Examiner*—Sin J. Lee
*Attorney, Agent, or Firm*—Thomas H. Magee

[57] ABSTRACT

Photopolymerizable printing plates with an improved resistance to UV-hardenable printing inks, have an elastomeric layer containing at least one thermoplastic, elastomeric, block copolymer comprising two or more polymer blocks comprising aromatic vinyl units, and one or more polymer blocks comprising isoprene and/or isoprene/butadiene units. The block copolymer has a vinyl bond content not above 70%, a glass transition temperature not above 20° C., and a peak temperature of a primary dispersion of tan δ not above 30° C.

8 Claims, No Drawings

FLEXOGRAPHIC PRINTING FORMS FOR UV-HARDENABLE PRINTING INKS

BACKGROUND OF THE INVENTION

1. Field of the Invention

The invention involves a photopolymerizable printing plate comprising a support, at least one photopolymerizable layer, an elastomeric layer containing at least one thermoplastic, elastomeric, block copolymer and at least one photoinitiator or a photoinitiator system, and a cover layer; and a flexographic printing form prepared from the plate.

2. Description of Related Art

Photopolymerizable printing plates are known for use in making flexographic printing forms. The printing surface is produced by exposing a photopolymerizable layer imagewise to actinic radiation and subsequently removing the unexposed, unphotopolymerized areas of the printing plate. Examples are found in the following patents: DE-C 22 15 090, U.S. Pat. No. 4,266,005, U.S. Pat. No. 4,320,188, U.S. Pat. No. 4,126,466 and U.S. Pat. No. 4,430,417. Such photopolymerizable printing plates usually comprise a support, an optional adhesive layer or other underlayer, one or more photopolymerizable layers, an optional, elastomeric, intermediate layer, and a cover layer.

A preferred method for making such multilayer photopolymerizable printing plates is a process in which a previously extruded photopolymerizable composition is fed into the nip of a calender and is calendered between a support and a cover element, thus forming a photopolymerizable layer between them. EP-B 0 084 851 discloses a preparation method for a multilayer photopolymerizable printing plate having an added elastomeric layer between the cover layer and the photopolymerizable layer.

The photopolymerizable layers contain polymeric binders, photopolymerizable monomers, photoinitiators, and added auxiliaries, such as plasticizers, fillers, stabilizers, etc. The polymeric binders are usually thermoplastic, elastomeric, block copolymers, as described, for example, in DE-C 22 15 090. These are generally A-B-A block copolymers having thermoplastic blocks A and elastomeric blocks B, particularly linear and radial block copolymers with polystyrene end blocks, such as, for example, polystyrene/polyisoprene/polystyrene, (polystyrene/polyisoprene)$_4$Si, or the corresponding butadiene polymers. The use of polymers having a certain vinyl content is also known for special purposes, such as, for example, for improving printing plate properties with special monomers (EP 0 525 206) or for preparing printing plates without monomer addition. Similar block copolymers and their use in highway engineering and automobile manufacture are described in EP-B 0 362 850. However, polystyrene/polybutadiene/polystyrene and polystyrene/polyisoprene/polystyrene block copolymers are preferred for making flexographic printing forms.

Nevertheless, current state-of-the-art printing forms frequently do not meet requirements for flexographic printing. In particular, when UV-hardenable inks are used, the printing forms are not sufficiently resistant to ink constituents diffusing into the forms. This increases layer thickness, changes image geometry on the printing form surface, and decreases Shore A hardness during printing. This is seen in the printed image as undesired spreading in positive image elements or as fine negative image elements running together.

Therefore, the present invention is based on the problem of making available flexographic printing forms that have improved resistance to UV-hardenable printing inks and that do not show the disadvantages described for printing forms of the current state-of-the-art, without adversely affecting other essential properties of the photopolymerizable printing plates or flexographic printing forms.

SUMMARY

This problem was solved surprisingly by a photopolymerizable printing plate comprising a support, at least one photopolymerizable layer, an elastomeric layer containing at least one thermoplastic, elastomeric, block copolymer and at least one photoinitiator or photoinitiator system, and a cover layer. The elastomeric layer contains at least one thermoplastic, elastomeric block copolymer comprising two or more polymer blocks synthesized from aromatic monomers and one or more polymer blocks synthesized from isoprene and/or isoprene/butadiene units. The block copolymer has a vinyl bond content not above 70%, a glass transition temperature not above 20° C., and a peak temperature of a primary dispersion of tan δ not above 30° C. A flexographic printing form is made from the so described photopolymerizable printing plate.

DESCRIPTION OF THE PREFERRED EMBODIMENT(S)

A photopolymerizable printing plate comprises a support, at least one photopolymerizable layer, an elastomeric layer containing at least one thermoplastic, elastomeric, block copolymer and at least one photoinitiator or photoinitiator system, and a cover layer. The elastomeric layer contains at least one thermoplastic, elastomeric block copolymer comprising two or more polymer blocks synthesized from aromatic monomers and one or more polymer blocks synthesized from isoprene and/or isoprene/butadiene units. The block copolymer has a vinyl bond content not above 70%, a glass transition temperature not above 20° C., and a peak temperature of a primary dispersion of tan δ not above 30° C. Surprisingly, the use of the polymers of the present invention increased substantially the resistance of flexographic printing forms to UV-hardenable printing inks. Furthermore, printing forms prepared from the materials of the invention show good ink transfer.

Block copolymers of the invention are thermoplastic, elastomeric, block copolymers that contain two or more blocks synthesized from aromatic monomers and one or more blocks synthesized from isoprene or isoprene/butadiene units. Polystyrene blocks and polyisoprene blocks are preferred. Polystyrene/polyisoprene/polystyrene tripleblock copolymers are particularly preferred.

The vinyl bond content of the block copolymers of the invention is not above 70%, is preferably 30–60%, and is measured by NMR (Nuclear Magnetic Resonance) spectra, as described in EP-B 0362 850. The glass transition temperature of the polymers of the invention is not above 20° C., and is preferably −20 to +10° C. The peak temperature of a primary dispersion of tan δ is not above 30° C., and is preferably −10 to +25° C., which is determined from viscoelastic measurements, with a Rheovibron® instrument from Orientec Corp. The aforementioned viscoelastic measurement is the same as or similar to that in EP-B 0362 850. The polystyrene content of the polymers of the invention is 10–30% by weight, preferably 15–25% by weight. The average molecular weight $M_n$ of these polymers is 30,000–280,000, preferably 60,000–220,000. The average molecular weight $M_n$ of an aromatic block is 3,000–40,000, and that of an elastomeric block containing vinyl groups is 10,000–200,000.

Polymers of the invention can be used alone or as mixtures with other thermoplastic, elastomeric, block copolymers containing ≦20% vinyl bonds. Polymer mixtures are preferred. In this case, the quantity of the polymers of the invention is not less than 20% by weight, preferably 20–80% by weight, relative to the total quantity of polymeric binder. The total quantity of binder in the elastomeric layer is 50–95% by weight.

Other particularly suitable block copolymers are described in DE-C 22 15 090; U.S. Pat. No. 4,320,188; U.S. Pat. No. 4,197,130, U.S. Pat. No. 4,430,417, or U.S. Pat. No. 4,162,919. In particular, linear and radial block copolymers having polystyrene end blocks, such as, for example, polystyrene/polyisoprene/polystyrene, (polystyrene/polyisoprene)$_4$Si, or the corresponding butadiene polymers are suitable as binders insofar as they are compatible with the binders of the invention. Polymers containing polyisoprene are particularly preferred. The average molecular weight $M_n$ of the block copolymers is usually between 80,000 and 300,000, preferably between 100,000 and 250,000. A polystyrene proportion of 10–40% by weight is advantageous, especially a content of 15–30% by weight.

The elastomeric layer usually contains a photoinitiator or a photoinitiator system, such as, for example, methyl benzoin, benzoin acetate, benzophenone, benzil dimethylketal, and ethyl anthraquinone/4,4'-bis (dimethylamino)benzophenone. Dyes, fillers, plasticizers, etc. can be used as other additives, as described in EP-B 084 851.

The elastomeric layer of the invention can be prepared by casting from solvents, such as toluene, acetone, methylethyl ketone, alcohols, etc., or mixtures of these solvents, or by extrusion coating directly on a conventional cover layer, such as, for example, polystyrene, polyethylene, polypropylene, or polyethylene terephthalate. The layer is then dried. The layer thickness is 0.01–0.5 mm, preferably 0.025–0.12 mm.

An optional, thin, nonadhesive polymer layer that can be removed by the developer solution is located between the cover layer and the elastomeric layer. Polyamides, ethylene/vinyl acetate copolymers, or similar polymers that form transparent and tear-resistant films are preferred. The layer thickness is 0.0025–0.038 mm.

A particular advantage of the elastomeric layer of the invention is that special photopolymerizable printing plates having a modified composition do not have to be prepared. Commercial photopolymerizable printing plates are used, on which only the additional printing layers must be coated. Thus, making such flexographic printing forms for use with UV inks is simpler and more economical.

The photopolymerizable layer of the printing plate usually contain block copolymers as described, for example, in DE-C 22 15 090; U.S. Pat. No. 4,320,188; U.S. Pat. No. 4,197,130, U.S. Pat. No. 4,430,417, or U.S. Pat. No. 4,162,919. In particular, linear and radial block copolymers having polystyrene end blocks, such as, for example, polystyrene/polyisoprene/polystyrene, (polystyrene/polyisoprene)$_4$Si, or the corresponding butadiene polymers are suitable as binders. The average molecular weight $M_n$ of the block copolymers is usually between 80,000 and 300,000, preferably between 100,000 and 250,000. A polystyrene proportion of 10–40% by weight is advantageous, especially a content of 15–30% by weight.

Ethylenically unsaturated compounds in the photopolymerizable layer are known monounsaturated or polyunsaturated monomers, such as, for example, esters or amides of acrylic acid or methacrylic acid with monofunctional or polyfunctional alcohols, amines, aminoalcohols, or hydroxyethers and hydroxyesters. Also suitable are mixtures of monounsaturated and polyunsaturated compounds, as described in DE-C1 37 44 243 and DE-A 36 30 474. Examples of addition-polymerizable compounds are butyl acrylate, isodecyl acrylate, tetradecyl acrylate, 2-hexyloxyethyl acrylate, 1,4-butanediol diacrylate, 1,6-hexanediol dimethacrylate, 1,6-hexanediol diacrylate, trimethylolpropane triacrylate, and dipentaerythritol monohydroxypentacrylate.

The photopolymerizable layer also contains one of the known photoinitiators or a photoinitiator system, for example, methylbenzoin, benzoin acetate, benzophenone, benzil dimethyl-ketal, or ethyl anthraquinone/4,4'-bis (dimethylamino)benzo-phenone.

The photopolymerizable layer generally contains 60–95% by weight of binder or binder mixture, 5–30% by weight of monomer or monomer mixture, and 0.5–5% by weight of initiator. It can contain other auxiliaries, such as, for example, fillers, dyes, antioxidants, antiozonants, thermal polymerization inhibitors, and plasticizers in the customary quantities.

Suitable supports for the photopolymerizable printing plates of the invention are, for example, sheets of various film-forming synthetic polymers. Polyester and polyester/polyamide sheets, optionally having an adhesive layer and/or an antihalation layer, are preferred, particularly polyethylene terephthalate sheets.

The preferred process for preparing the photopolymerizable printing plate is by extruding and then calendering the photopolymerizable composition between the support and a cover element. This process is described in EP-B1 084 851. The cover element comprises a cover layer, an elastomeric layer according to the invention and optionally a flexible polymer layer as already described.

The photopolymerizable printing plate is exposed imagewise through a negative by commonly used methods. The cover layer of the photopolymerizable printing plate is removed as usual before imagewise exposure. Any type and source of actinic radiation can be used to prepare the flexographic printing forms. Suitable radiation sources are, for example, mercury vapor lamps, incandescent lamps with special phosphors that emit ultraviolet light, argon incandescent lamps, and photo lamps. The most suitable among these are mercury vapor lamps, particularly ultraviolet light lamps, and ultraviolet fluorescent lamps.

An overall backside exposure can be made before or after imagewise exposure. This exposure can be diffuse or directional. The exposure source can be all of the radiation sources conventionally used for the imagewise exposure.

Unphotopolymerized areas of the printing plate can be washed off with suitable developer solutions, such as, for example, aliphatic or aromatic hydrocarbons, such as n-hexane, petroleum ether, hydrogenated petroleum fractions, limonene or other terpenes, toluene, isopropyl benzene, etc., ketones, such as, for example, methylethyl ketone, halogenated hydrocarbons, such as chloroform, trichloroethane, or tetrachloroethylene, esters, such as, for example, acetic acid esters, acetoacetic acid esters, or mixtures of these solvents. Additives, such as surfactants or alcohols, are possible constituents. After being dried, the resulting printing forms can be postexposed or post-treated chemically in any sequence to make a nontacky printing surface.

EXAMPLES

The following examples are intended to explain the present invention. Parts and percentages, unless otherwise stated, are by weight. The average molecular weights of the polymers are specified as number average, $M_n$.

EXAMPLE 1

Elastomeric layers 35 μm thick were prepared by casting from a slit coater and subsequently drying a composition comprising 96.5% of a binder mixture of a polystyrene/ polyisoprene/polystyrene tri block co-polymer sold under the tradename VS-3 polymer (from Kuraray Company, Japan), having vinyl content 37%, glass transition temperature −17° C., peak temperature of tan δ −3° C., polystyrene content 20%, and a styrene/isoprene/styrene linear block copolymer sold under the trademark Cariflex® 1107 (from the Shell Company) (binder ratio shown in Table 1), 3% Irgacure 651 and 0.5% of a commercial blue dye. These layers were applied with heat and pressure on the photopolymer layers of commercial Cyrel® flexographic printing plates from the DuPont Company. These plates were processed in the usual manner (that is, exposed, washed out, and postexposed). Pieces of 3×3 cm were cut out from the solids. The samples were overcoated for 24 hours with UV ink (magenta from the Hartmann Company), cleaned, and measured again. The percent weight increase and the thickness increase of each sample are listed in Table 1.

TABLE 1

| | Material | % Weight Increase | Thickness Increase (μm) |
|---|---|---|---|
| 1 | Without elastomeric layer | 1.78 | 27 |
| 2 | With elastomeric layer Binder Ratio | | |
| | VS-3%    1107% | | |
| a) | 3.5         1 | 1.23 | 4 |
| b) | 2            1 | 1.28 | 15 |
| c) | 1.6         1 | 1.32 | 15 |

We claim:

1. A photopolymerizable printing plate comprising a support, at least one photopolymerizable layer, and an elastomeric layer containing at least one thermoplastic elastomeric block copolymer and at least one photointitator or photoinitiator system, characterized in that the block copolymer comprises two or more polymer blocks comprising aromatic vinyl units, and one or more polymer blocks comprising isoprene and/or isoprene/butadiene units, said block copolymer having a vinyl bond content between 30 to 60% by weight, a glass transition temperature not above 20° C., and a peak temperature of a primary dispersion of tan δ not above 30° C.

2. The photopolymerizable printing plate according to claim 1, characterized in that the vinyl bond content of the thermoplastic, elastomeric, block copolymer is not above 40% by weight.

3. The photopolymerizable printing plate according to claim 1, characterized in that the thermoplastic, elastomeric, block copolymer is a polystyrene/polyisoprene/polystyrene triple-block copolymer.

4. The photopolymerizable printing plate according to claim 3, characterized in that the polystyrene content of the thermoplastic, elastomeric, block copolymer is 10–30% by weight.

5. The photopolymerizable printing plate according to claim 1, characterized in that the glass transition temperature of the thermoplastic, elastomeric, block copolymer is not above 0° C.

6. The photopolymerizable printing plate according to claim 1, characterized in that a polystyrene/polyisoprene/ polystyrene block copolymer having a vinyl bond content ≦20% by weight is used as an added binder.

7. The photopolymerizable printing plate according to claim 1, characterized in that the quantity of thermoplastic, elastomeric, block copolymer is 20–80% by weight, relative to the total quantity of polymeric binder in the elastomeric layer.

8. The photopolymerizable printing plate according to claim 1, characterized by the presence of an additional polymeric protective layer between the photopolymerizable layer and the cover element.

* * * * *